United States Patent [19]
Amano

[11] Patent Number: 4,711,699
[45] Date of Patent: Dec. 8, 1987

[54] PROCESS OF FABRICATING SEMICONDUCTOR DEVICE

[75] Inventor: Haruo Amano, Tokyo, Japan

[73] Assignee: NEC Corporation, Japan

[21] Appl. No.: 855,756

[22] Filed: Apr. 24, 1986

[30] Foreign Application Priority Data

Apr. 25, 1985 [JP] Japan .................... 60-89316

[51] Int. Cl.$^4$ ............ H01L 21/306; B44C 1/22; C03C 15/00; C03C 25/06
[52] U.S. Cl. ............................. 437/52; 156/646; 156/653; 156/657; 156/662; 156/643; 357/49; 437/228; 29/580
[58] Field of Search .................... 29/576 W, 591, 571, 29/580; 148/1.5, 187; 427/88–91, 93; 156/643, 646, 653, 657, 659.1, 662; 204/192 EC, 192 E; 357/23.1, 23.14, 41, 49

[56] References Cited

U.S. PATENT DOCUMENTS 4,219,379 8/1980 Athanas .................... 427/93 X
4,305,200 12/1981 Fu et al. .................... 427/93 X Primary Examiner—William A. Powell
Attorney, Agent, or Firm—Laff, Whitesel, Conte & Saret

[57] ABSTRACT

A process of fabricating a semiconductor device, comprising preparing a semiconductor substrate having a conductor layer formed on a surface thereof, the conductor layer having a step portion over the surface of the semiconductor substrate, forming a layer of polysilicon having a portion overlying the step portion of the conductor layer, and thermally oxidating the polysilicon layer for forming a polysilicon oxide layer having a portion substantially resulting from the portion of the polysilicon layer, the portion of the polysilicon oxide layer being thicker than another portion of the polysilicon oxide layer and becoming thinner away from the step portion of the conductor layer.

6 Claims, 23 Drawing Figures

PROCESS OF FABRICATING SEMICONDUCTOR DEVICE

FIELD OF THE INVENTION

The present invention relates to a process of fabricating a semiconductor substrate and, more particularly, to a method of forming an interlevel insulating layer in a semiconductor device having multiple conductor layers forming contacts, electrodes, leads, intra-chip interconnections and other wiring elements.

BACKGROUND OF THE INVENTION

The growing use of semiconductor devices has resulted in requirements for higher speed and higher density devices. High density devices are realized by the drastic improvements achieved in photolithographic technologies which now permit of extreme microminiaturization of the geometries of patterned layers of the devices. In order to implement such shrunk design rules for semiconductor devices, a variety of planarization techniques have been proposed and put into practice to alleviate the irregularities of topography of the devices. Most responsible for such irregularities of device topography are the presence of conductor layers such as contracts and interconnections which form step portions on the surface of a semiconductor substrate.

DESCRIPTION OF THE PRIOR ART

FIGS. 1A and 1B of the drawings show cross sectional configurations of a semiconductor device at different stages of fabrication by a known process. The device herein shown is representative of the most simplified version of a semiconductor device having a multilevel conductor arrangement and is fabricated in a manner, particularly, to planarize the device structure by the step coverage with interlevel insulating layers.

The semiconductor device herein exemplified has a semiconductor substrate 10 having conductor regions 12a and 12b which form part of a first conductor layer of the multilevel conductor structure of the device to be fabricated. These conductor regions 12a and 12b are formed on the surface of the semiconductor substrate 10 by ordinary photolithographic techniques and typically consist of doped polysilicon. The surface of the resultant structure is totally covered with an epitaxially grown conformal layer 14 of silicon oxide. This silicon oxide layer 14 is to form part of an interlevel insulating layer of the device to be fabricated. It will be seen that the insulating oxide layer 14 has step portions which are accentuated as compared with the step portions of the conductor regions 12a and 12b per se. On this insulating oxide layer 14 in turn is formed a coating of a phosophor-containing solution of silanol, followed by heat-treatment of the coating to form a glassified silica layer 16 as shown in FIG. 1B. This glassified silica layer 16 is also to form part of the interlevel insulating layer of the device to be fabricated. The glassified silica layer 16 is thicker over the bottoms of the step portions in the underlying oxide layer 14 than over the other areas of the layer 14 and sufficiently covers the accentuated step portions of the layer 14, thus serving successfully as a planarizing layer in the device. On the silica layer 16 is usually formed a metallized layer of, for example, aluminum as a second conductor layer of the device, though not shown in FIG. 1B. In this instance, the device is further provided with interlevel contact regions providing connections between the first and second conductor layers forming the multilevel conductor structure of the device.

In the meantime, conductor regions on a semiconductor substrate are usually formed using anisotropic etching techniques to provide a microminiaturized pattern of the regions. As well known in the art, patterns formed by anisotropic etching techniques ordinarily have sharp, abrupt edges or step portions. As more conductor layers are used and accordingly form more crossings in a semiconductor structure and more interlevel contact regions are provided in the structure, such sharp and abrupt step portions of the conductor regions on the semiconductor substrate result in formation of more serious step profiles in the overlying layer or layers, as is the case with the insulating oxide layer 14 in the described prior-art device. It will be seen from FIG. 1A that the step portions originally formed by the conductor regions 12a and 12b on the semiconductor substrate 10 are accentuated in the oxide layer 14 overlying the conductor regions 12a and 12b. If another semiconductor layer is formed on the layer overlying the conductor regions, the additional layer is sometimes unable to completely cover such accentuated step portions of the underlying layer. When this occurs, the additional layer such as the glassified silica layer 16 in the described prior-art device may form cracks 18 and/or cavities 20 in its portion covering the step portions of the underlying oxide layer 14 as depicted to an enlarged scale in FIG. 2.

Depending upon the configuration of the semiconductor device to be fabricated, polysilicon may be deposited on a semiconductor substrate having conductor regions thereon and patterned and etched to remain solely on the conductor regions. The layer of polysilicon thus left on the conductor regions is then themally oxidated to form an interlevel oxide layer as an alternative to the conformal insulating oxide layer 14 in the described prior-art device. In this instance, the patterned layer of polysilicon overlying the conductor regions may form overhangs along the edges of the individual conductor regions on the substrate when the polysilicon layer is grown into oxide by thermal oxidation. If an additional insulating layer such as the above mentioned glassified silica layer 16 is formed on such a polysilicon insulating oxide layer possibly for the purpose of contributing to the surface planarization of the device, these overhangs of the oxide layer would facilitate formation of cracks and/or cavities in the additional insulating layer or glassified silica layer 16.

If cracks and/or cavities are formed in an interlevel insulating layer of a semiconductor device, the device would have serious irregularities in its performacne characteristics such as the threshold voltages for transistors. This will critically impair the reliability of operation and yield of production of semiconductor devices. Where overhangs are formed by a thermally grown oxide layer, the additional insulating layer which may be formed on the oxide layer for contributing to the surface planarization of the device could not even achieve the particular purpose unless the overhangs are covered with the additional insulating layer throughly and with an adequate thickness.

SUMMARY OF THE INVENTION

It is, accordingly, an important object of the present invention to provide an improved process of fabricating a semiconductor substrate having multiple conductor layers and an interlevel insulating layer free from crack and cavities.

It is another important object of the present invention to provide an improved method of forming in a semiconductor device having multiple conductor layers an interlevel insulating layer which is highly planarized and which is free from cracks and cavities.

In accordance with one outstanding aspect of the present invention, there is provided a process of fabricating a semiconductor device, comprising (a) preparing a semiconductor substrate having a conductor layer formed on a surface thereof, the conductor layer having a step portion over the surface of the semiconductor substrate, (b) forming a layer of polysilicon having a portion overlying the step portion of the conductor layer, and (c) thermally oxidating the polysilicon layer for forming a polysilicon oxide layer having a portion substantially resulting from the portion of the polysilicon layer, the portion of the polysilicon oxide layer being thicker than another portion of the polysilicon oxide layer and becoming thinner away from the step portion of the conductor layer.

In accordance with another outstanding aspect of the present invention, there is provided a process of fabricating a semiconductor device, comprising (a) preparing a semiconductor substrate having a first conductor layer formed on a surface thereof, the conductor layer having a step portion over the surface of the semiconductor substrate, (b) forming a layer of polysilicon having a portion overlying the step portion of the conductor layer, (c) thermally oxidating the polysilicon layer for forming a polysilicon oxide layer having a portion substantially resulting from the portion of the polysilicon layer, the portion of the polysilicon oxide layer being thicker than another portion of the polysilicon oxide layer and becoming thinner away from the step portion of the conductor layer, and (d) forming a second conductor layer overlying the polysilicon oxide layer.

In accordance with still another outstanding aspect of the present invention, there is provided a process of fabricating a semiconductor device, comprising (a) preparing a semiconductor substrate having a first conductor layer formed on a surface thereof, the conductor layer having a step portion over the surface of the semiconductor substrate, (b) forming a silicon oxide layer having a portion overlying the first conductor layer and an overhang portion located over the substrate in proximity to the step portion of the conductor layer, (c) forming a layer of polysilicon having a portion overlying the step portion of the conductor layer and fully covering the overhang portion of the silicon oxide layer, (d) thermally oxidating the polysilicon layer for forming a polysilicon oxide layer having a portion substantially resulting from the portion of the polysilicon layer, the portion of the polysilicon oxide layer being thicker than another portion of the polysilicon oxide layer and becoming thinner away from the step portion of the conductor layer, and (e) forming a second conductor layer overlying the polysilicon oxide layer.

BRIEF DESCRIPTION OF THE DRAWINGS

The features and advantages of a method according to the present invention will be more clearly appreciated from the following description taken in conjunction with the accompanying drawings in which like reference numerals designate similar or corresponding layers, regions and elements and in which.

DESCRIPTION OF THE PREFERRED EMBODIMENTS

Figure 3A:
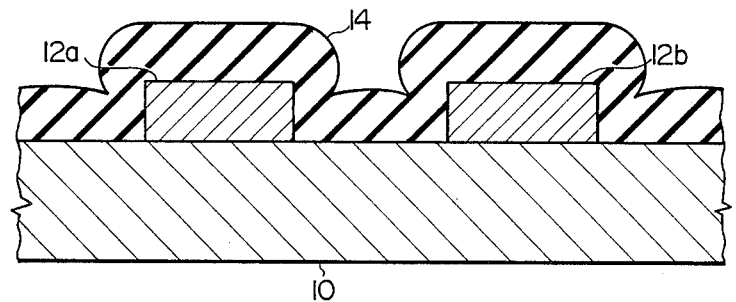
FIGS. 3A to 3D are fragmentary sectional views showing cross sectional configurations of a semiconductor device having a multilevel conductor structure at different stages of fabrication of a process according to a first preferred embodiment of the present invention.

Referring to the drawings, first to FIG. 3A, a process of fabricating a semiconductor device in accordance with the first preferred embodiment of the present invention starts with preparation of a suitable semiconductor substrate 10. The semiconductor substrate 10 may be part of an intact or raw wafer of doped or undoped monocrystalline silicon or may be part of a multilayer structure which has already formed thereon or therein any of various active regions and insulating and/or dielectric layers. On the surface of this semiconductor substrate 10 are provided conductive regions which are herein shown including two conductor regions 12a and 12b of doped polysilicon. These conductor regions 12a and 12b typically consist of doped polysilicon uniformly deposited on the surface of the semiconductor substrate 10. The resultant layer of polysilicon is patterned and etched by ordinary photolithographic techniques typically using anisotropic etching. The conductor regions 12a and 12b thus provided on the semiconductor substrate form part of a first conductor layer of the multilevel conductor structure of the device to be fabricated and may be contacts, electrodes, leads, intrachip interconnections or other wiring elements. While the semiconductor substrate 10 is herein shown having a planar surface, a semiconductor substrate for use in a process according to the present invention may have an undulating or otherwise irregular surface topography. Thus, the conductor regions 12a and 12b provided on the substrate 10 may not be formed on a common horizontal plane.

Figure 1A:
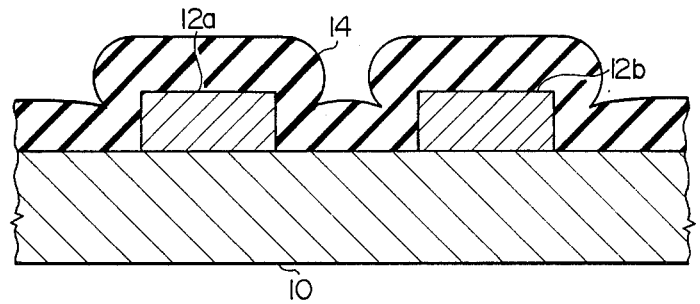
FIGS. 1A and 1B are fragmentary sectional views showing cross sectional configurations of a semiconductor device having a multilevel conductor structure at different stages of fabrication of a known process.
Figure 1B:
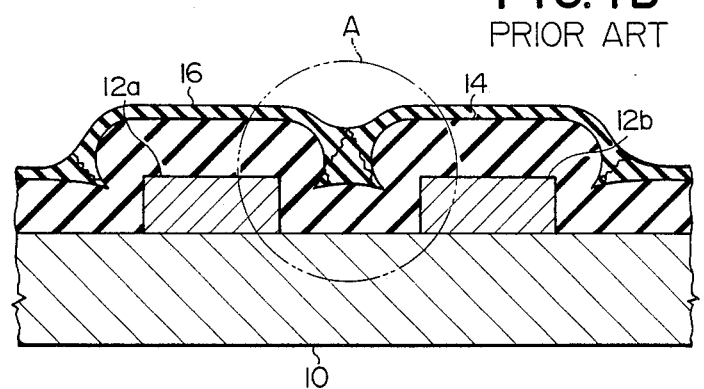
Figure 2:
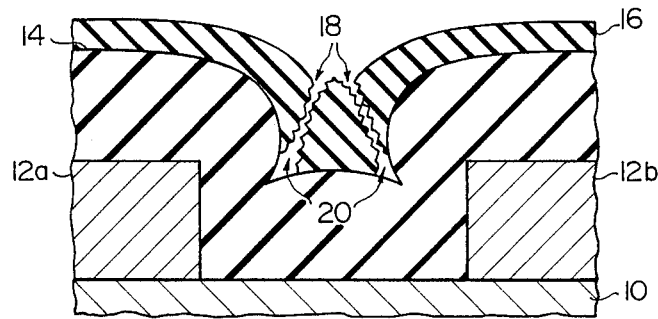
FIG. 2 is a fragmentary sectional view showing, to an enlarged scale, a portion of the structure as enclosed in circle "A" in FIG. 1B.

The surface of the resultant structure is totally covered with a conformal layer 14 of silicon oxide which is epitaxially grown on the surfaces of the substrate 10 and conductor regions 12a and 12b by, for example, chemical vapor deposition (CVD) techniques. This silicon oxide layer 14 is to form part of an interlevel insulating layer of the device to be fabricated. As previously noted with reference to FIG. 1A, the insulating oxide layer 14 has step portions which are rather accentuated as compared with the step portions of the conductor regions 12a and 12b per se.

Figure 3B:
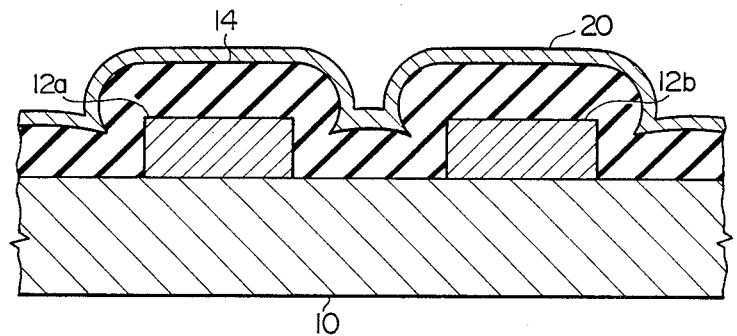
Figure 3C:
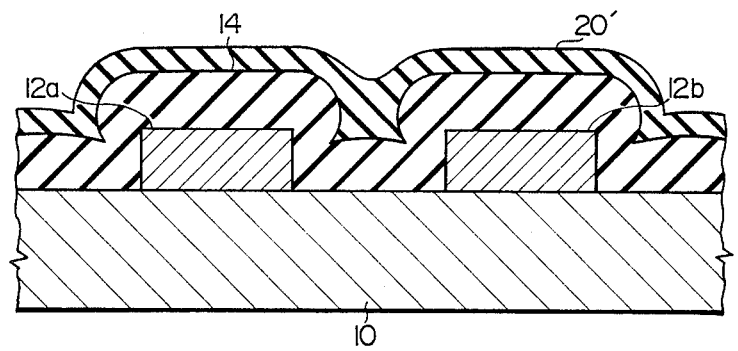

In a process according to the present invention, a conformal layer 20 of polysilicon is epitaxially grown on the entire surface of the insulating oxide layer 14 typically by chemical vapor deposition techniques, as shown in FIG. 3B. Generally, polysilicon is deposited firmly on the surfaces forming a step portion as well known in the art and, for this reason, the polysilicon layer 20 deposited on the step-forming oxide layer 14 rarely produces voids at its interface with the underlying oxide layer 14 although the oxide layer 14 per se has sharp notches at the bottoms of its step portions. The polysilicon layer 20 is then thermally oxidized and thickened into an oxide layer 20' as shown in FIG. 3C. The polysilicon oxide layer 20' grows thicker over the step portions of the underlying insulating oxide layer 14 than over the remaining areas of the silicon oxide layer 14 as will be seen from FIG. 3C and thus provides a smoothly undulating surface topography more or less compensating for the step portions of the underlying layer 14.

Figure 3D:
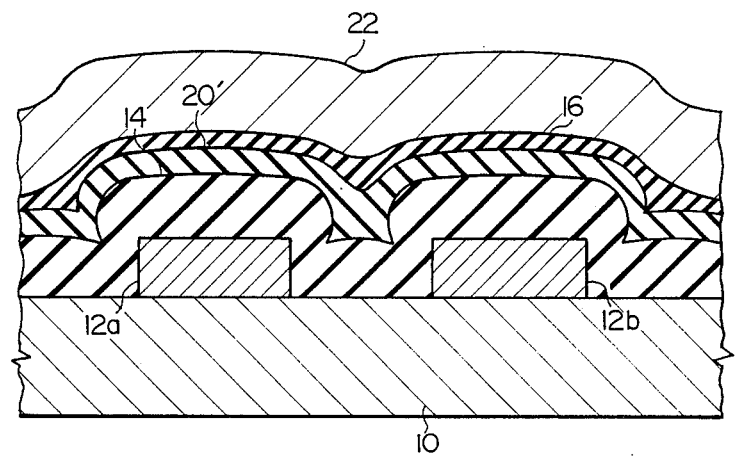

On the entire surface of the insulating oxide layer 20' in turn is spin coated a glassifiable semiconductor material such as a phosphor-containing solution of silanol ($H_nSi(OH)_{4-n}$). The resultant coating of the silanol solution is baked at a temperature ranging from 400° C. to 450° C. to form a glassified silica layer 16 as shown in FIG. 3D. This glassified silica layer 16 is also thicker particularly over the bottoms of the step portions in the underlying silicon oxide layer 14 than over the other areas of the layer 14. For this reason and because, in addition, of the planarization effect achieved by the underlying polysilicon insulating oxide layer 20', the glassified silica layer 16 provides a further improved surface topography of the multilevel structure. Thus, the glassified silica layer 16 adequately compensates for the accentuated step portions of the layer 14 and serve successfully as a planarizing layer in the device. The silica layer 16 is also to form part of the interlevel insulating layer of the device to be fabricated. On the silica layer 16 is further formed a metallized layer 22 of, for example, aluminum as a second conductor layer of the device by, for example, vacuum deposition or magnetron sputtering techniques, as shown in FIG. 3D. Though not shown in the drawings, the device is further provided with interlevel contact regions providing connections between the first and second conductor layers forming the multilevel conductor structure of the device.

Figure 4:
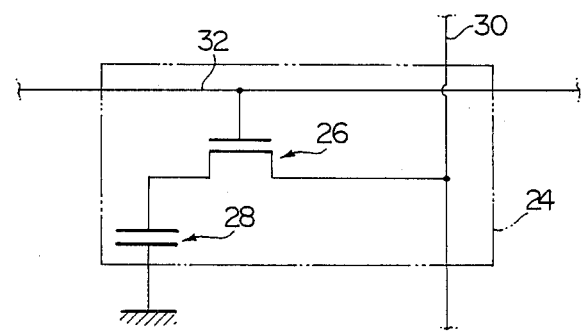
FIG. 4 is a schematic view showing the circuit arrangement of a single-transistor single-capacitor memory cell for use in a dynamic random access memory.

FIG. 4 of the drawings shows the circuit arrangement of a single-transistor single-capacitor memory cell which may be fabricated by the use of a process according to the present invention. The single-transistor single-capacitor memory cell, designated in its entirety by reference numeral 24, is provided as a memory unit in a dynamic random access memory and is shown comprising the combination of a single transistor 26 and a single capacitor 28. The memory cell 24 is one of a number of such cells arranged in a matrix array composed of a number of bit lines 30 and a number of word lines 32 and is located at the crossing of one of the bit lines 30 and one of the word lines 32. The transistor 26 is herein assumed to be a field-effect transistor (FET) of the n-channel type by way of example and has its gate connected to the word line 32 and one of its source and drain connected to the bit line 30. The other of the source and drain of the transistor 26 is connected to one electrode of the capacitor 28, the other electrode of which is connected to ground line. The modes of operation of the memory cell 10 thus constructed are per se well known in the art and will not be herein explained.

Description will now be made with reference to FIGS. 5A to 5H of the drawings in regard to a process of fabricating the single-transistor single-capacitor memory cell in accordance with the present invention. The process for the fabrication of the memory cell as hereinafter described provides a second preferred embodiment of the invention.

Figure 5A:
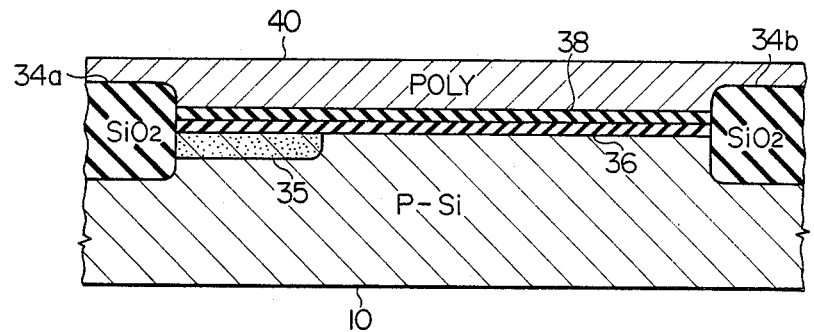
FIGS. 5A to 5H are fragmentary sectional views showing cross sectional configurations of a semiconductor device having a multilevel conductor structure at different stages of fabrication of a process according to a second preferred embodiment of the present invention.

Referring to FIG. 5A, a process of fabricating a semiconductor device in accordance with the second preferred embodiment of the present invention starts with preparation of a semiconductor substrate 10 of, for example, p-type. Field oxide regions 34a and 34b are formed in this p-type semiconductor substrate 10 by, for example, selective oxidation of the bulk substrate, forming an island therebetween. A donor-type dopant is then introduced into a selected surface portion of the substrate 10 to form an n-type region 35 adjacent one field oxide region 34a. This n-type region 35 is to provide one of the electrodes of the capacitor 28 which forms part of the memory cell 24 shown in FIG. 4. On the entire surface of this semiconductor substrate 10 is then thermally grown a thin silicon oxide film 36. This results in a slight increase in the thickness of the field oxide regions 34a and 34b. A thin film 38 of silicon nitride ($Si_3N_4$) is then deposited on the silicon oxide film 36 by, for example, chemical vapor deposition techniques. The silicon nitride film 38 is patterned and etched to remain on the island between the field oxide regions 34a and 34b. Doped polysilicon is conformally deposited on the entire surface of the resultant structure by, for example, chemical vapor deposition techniques to form a considerably thick polysilicon layer 40. The structure shown in FIG. 5A is obtained by the formation of this polysilicon layer 40.

Figure 5B:
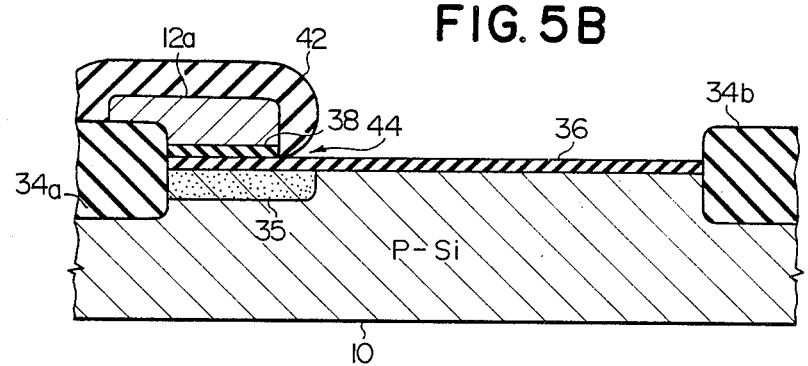

Though not shown in the drawings, a suitable photoresist material is then spin coated on the surface of the doped polysilicon layer 40 and is etched with use of a suitable photomask. This etching step is performed preferably in an anisotropic mode to provide a finely defined conductor pattern. The resist film is then stripped to leave a conductor region 12a on a selected area of the silicon nitride film 38 as shown in FIG. 5B. The conductor region 12a thus formed is to provide the other electrode of the capacitor 28 connected to the source/drain of the transistor 26 of the memory cell 24 shown in FIG. 4. The conductor region 12a is then used as a mask to have the silicon nitride film 38 etched away from the surface of the substrate 10 except for the area underlying the conductor region 12a. As a result of this etching step, the oxide film 36 on the semiconductor substrate 10 is exposed over its area except for the area underlying the residual nitride film region 38. The nitride film region 38 and the coextensive regions of the oxide film 36 underlying the nitride film 38 are to form the dielectric layer of the capacitor 28 of the memory cell 24 shown in FIG. 4. The conductor region 12a on such a nitride film region 38 is then thermally oxidized to grow an oxide layer 42 on the surface of the region 12a as shown in FIG. 5B. This oxide layer 42 is to form part of an interlevel insulating layer of the device to be fabricated and has a step portion resulting from the step portion of the conductor region 12a. The oxide layer 42 is grown not only on the upper surface and sidewall of the conductor region 12a but slightly along the edges of the silicon nitride film region 38. Thus, the oxide layer 42 has an overhang portion 44 as shown in FIG. 5B.

Thereupon, the nitride film 38 and the oxide film 36 are selectively etched away with the oxide film 42 used as a mask to exposed a portion of the surface of the substrate 10. A thermal oxidation process is then performed to form a new oxide film 36' on the exposed surface portion of the substrate 10 as shown in FIG. 5C.

Figure 5C:
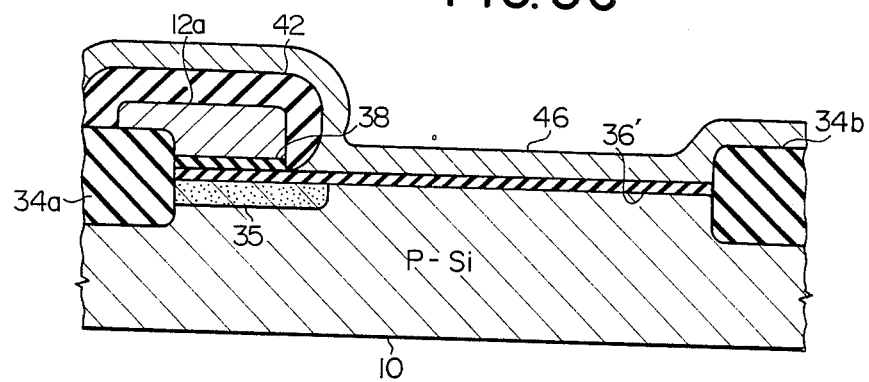
Figure 5D:
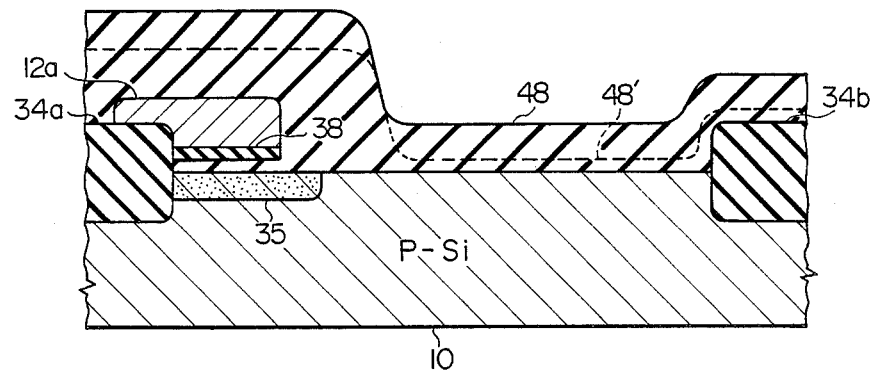

In the second preferred embodiment of a process according to the present invention, a conformal layer 46 of polysilicon is epitaxially grown on the surfaces of the oxide film 36' and the oxide layer 42 on the conductor region 12a as shown in FIG. 5C. This polysilicon layer 46 is grown to a thickness of, typically, about 500 Angstroms by, for example, chemical vapor deposition techniques. The polysilicon 46 has a step portion resulting from the step portion of the oxide layer 42 as shown but is free from void at its interfaces with the underlying oxide film 36 and the sidewall of the oxide layer 46 since polysilicon is deposited firmly on the surfaces forming a step portion as previously noted. The polysilicon layer 46 is then thermally oxidized and thickened to form a thicker oxide layer 48 which has resulted in part from the polysilicon layer 46 and in part from the oxide film 36 and the oxide layer 42 as shown in FIG. 5D. The oxide layer 48 grows thicker over its area close to the overhang portion 44 of the oxide layer 42 than over the remaining areas of the oxide layer 48 as will be seen from FIG. 5D and thus provides a smoothly sloping step portion completely filling the space which has been open below the overhang portion 44 of the oxide layer 42. The oxide layer 48 thus formed is also to form part of the interlevel insulating layer of the device to be fabricated.

Figure 5E:
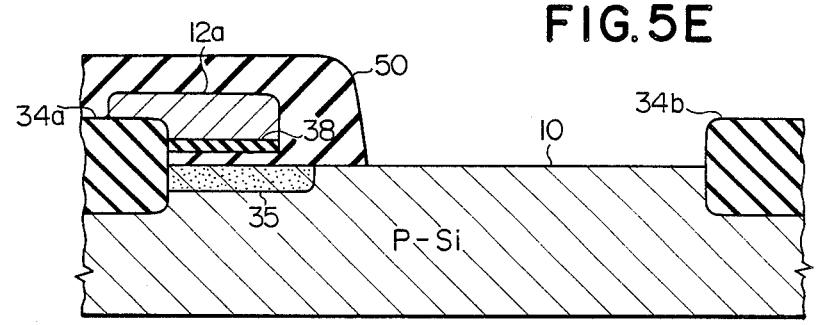

The oxide layer 48 is then etched away throughout its area typically by reactive ion etching techniques in an anisotropic mode. Suitable endpoint control is used for this dry etching step so that the etching will terminate halfway of the initial thickness of the oxide layer 48. It may be noted that the sidewall of the oxide layer 48 is practically unaffected by the etching process by reason of the anisotropic nature of the etch as well known in the art. The result is therefore that the initial oxide layer 48 in its entirety is reduced only in the direction of thickness, leaving a layer 48' having a surface topography indicated by a dotted line in FIG. 5D. The etching being terminated halfway of the initial thickness of the oxide layer 48, the oxide layer 48 is not thoroughly etched away from the surface of the semiconductor substrate 10, which is thus protected from being damaged and contaminated by the dry etching step. The remaining oxide layer layer 48' is then etched by appropriate wet etching techniques until the layer 48' has its area remote from the conductor region 12a completely removed from the surface of the semiconductor substrate 10. The substrate 10 is thus allowed to be exposed adjacent a polysilicon oxide layer 50 which is now formed around the conductor region 12a, as shown in FIG. 5E. As a result of the anistotropic etching process, this polysilicon oxide layer 50 has a relatively abrupt sidewall forming a relatively steep step portion over the exposed surface of the semiconductor substrate 10. By virtue of the two-step etching process, the oxide layer 50 has over its area overlying the conductor region 12a a thickness significantly smaller than the initial thickness of the oxide layer 48. This however causes no problems because of the sufficiently large thickness (500 Å) to which the polysilicon layer 46 was deposited prior to the two-step etching process.

Figure 5F:
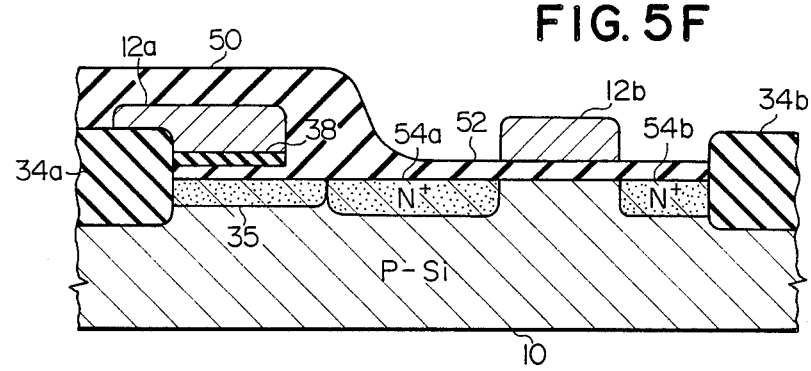

The semiconductor structure thus obtained is subjected to thermal oxidation treatment to grow on the exposed surface of the semiconductor substrate 10 a thin oxide film 52 which merges with the oxide layer 50 as shown in FIG. 5F. This thin oxide film 52 is to form, in part, the gate region of the field-effect transistor 28 of the memory cell 24 shown in FIG. 3. As the oxide film 52 is grown on the surface of the substrate 10, the oxide layer 50 on the conductor region 12a is also slightly thermally oxidized and is therefore allowed to smoothly slope toward the oxide film 52. This is more or less conducive to moderation of the step portion of the 50. It will thus be understood that the polysilicon layer 46 which results into a portion of the oxide layer 50 contributes to eliminating the open space which would otherwise result from the overhang portion 44 of the polysilicon oxide layer 42 (FIG. 5B) and to alleviating the seriousness of the step portion of the oxide layer 50 which results in part from the oxide layer 42.

Figure 5G:
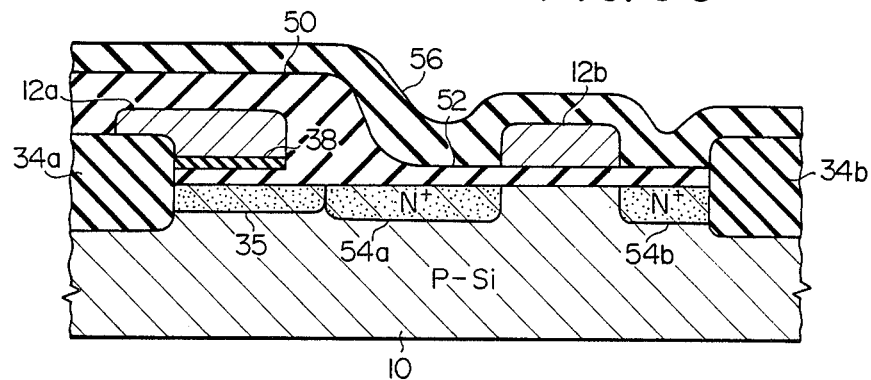

A conformal layer of doped polysilicon is then deposited on the entire surface of the resultant structure by, for example, chemical vapor deposition techniques. The doped polysilicon layer is patterned and etched, preferably, in an anisotropic mode, to leave a conductor region 12b on the surface of the oxide film 52 as shown in FIG. 5G. This conductor region 12b is to form the gate electrode of the field-effect transistor 28 of the memory cell 24 shown in FIG. 3 and provides, in combination with the conductor region 12a embedded in the oxide layer 50, a first interlevel insulating layer of the device to be fabricated. A suitable donor-type dopant such as phosphorus is then introduced, viz., implanted or diffussed, into selected portions of the semiconductor substrate 10 to form n+-type regions 54a and 54b on both sides of the conductor region 12b as also shown in FIG. 5G. These n+-type regions 54a and 54b of the semiconductor substrate 10 are to form the source and drain of the field-effect transistor 26 of the memory cell 24 shown in FIG. 4. The transistor 26 in the memory cell 24 shown in FIG. 4 being assumed to be of the n-channel type, the n+-type region 54a forms the souece of the transistor 26 and, thus, merges with the n-type region 35 in the substrate 10. It may be noted that the n+-type regions 54a and 54b can be formed in a self-aligned fashion with the conductor region 12b used as a mask during implantation or diffusion of the dopant.

Figure 5H:
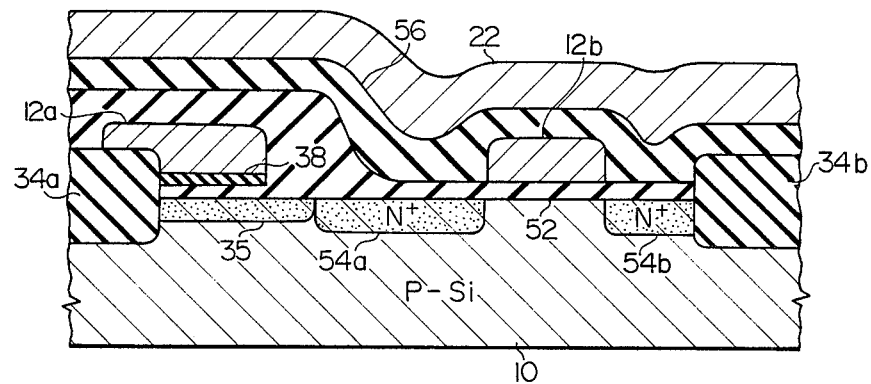

The resultant structure is then thermally oxidized to grow an oxide layer 56 on the oxide layer 50 and the oxide film 52 and on the conductor region 12b, as shown in FIG. 5G. This oxide layer 56 is also thicker particularly over the bottoms of the step portions in the underlying topography than over the other areas of the layer 56. The oxide layer 56 is therefore free from cracks and cavities which would otherwise result from thinned step profiles as previously noted. Because, furthermore, of the oxide layer 50 smoothly sloping toward the oxide film 52, the oxide layer 56 provides a considerable degree of surface planarization over the device area. The interlevel insulating layer of the device is now complete with the oxide layer 56 in addition to the oxide layer 50 and the oxide film 52. A contact hole is then formed in the oxide layers 56 and 62 to reach the surface of the n+-type region 54b in the substrate 10, though not shown in the drawings. A metallized layer 22 of, for example, aluminum is now deposited, patterned and etched to form a second conductor layer of the device by, for example, vacuum deposition or magnetron sputtering techniques, as shown in FIG. 5H. This metalized layer 22 is in contact with the n+-type region 54b through the contact holes formed in the layers 56 and 52 as above noted and provides the bit line 30 in the memory cell 24 illustrated in FIG. 4. Though not shown in the drawings, the device is further provided with interlevel contact regions providing connections between the first and second conductor layers forming the multilevel conductor structure of the device.

FIGS. 6A to 6G of the drawings show cross sectional configurations which are to form part of a semiconductor device providing the memory cell 26 shown in FIG. 4. The shown cross sectional configurations are achieved at different stages of fabrication of a process according to a third preferred embodiment of the present invention.

Figure 6A:
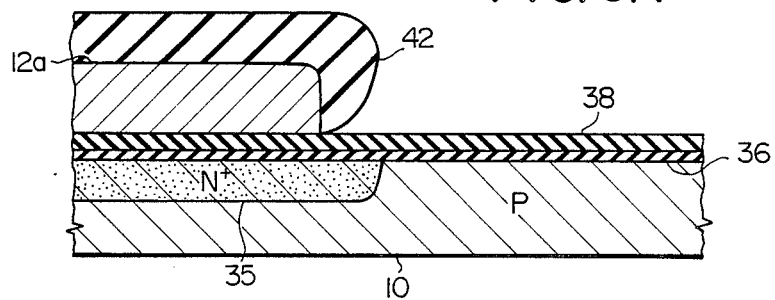
FIGS. 6A to 6G are fragmentary sectional views showing cross sectional configurations of a semiconductor device having a multilevel conductor structure at different stages of fabrication of a process according to a third preferred embodiment of the present invention.
Figure 6B:
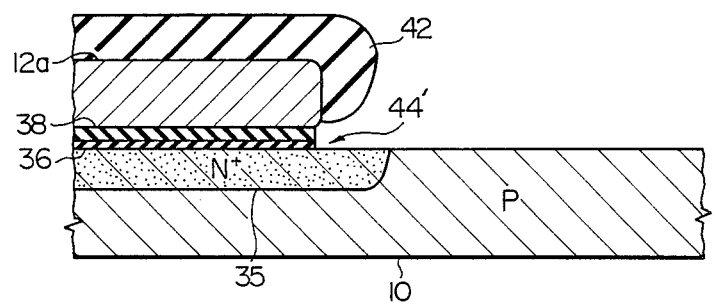

Referring to FIG. 5A, a process of fabricating a semiconductor device in accordance with the third preferred embodiment of the present invention also starts with preparation of a semiconductor substrate 10 of, for example, p-type. Though not shown, field oxide regions are formed in this semiconductor substrate 10 by, for example, selective oxidation of the bulk substrate, whereupon a donor-type dopant is introduced into a selected surface portion of the substrate 10 to form an N-type region 35 adjacent one of the field oxide regions. This n+-type region 35 to provide one of the electrodes of the capacitor 28 which forms part of the memory cell 24 shown in FIG. 4. On the entire surface of this semiconductor substrate 10 is then thermally grown a silicon oxide film 36, whereupon a film 38 of silicon nitride is deposited on the silicon oxide film 36 as in the process described with reference to FIGS. 5A to 5H. The silicon nitride film 38 is patterned and etched to remain on the island between the field oxide regions 34a and 34b. Doped polysilicon is conformally deposited on the entire surface of the resultant structure to form a considerably thick polysilicon layer. This doped polysilicon layer is patterned and etched preferably in an anisotropic mode to leave a conductor region 12a on a selected area of the silicon nitride film 38 as shown in FIG. 6A. The conductor region 12a thus formed is to provide the other electrode of the capacitor 28 connected to the source/drain of the transistor 26 of the memory cell 24 shown in FIG. 4. The conductor region 12a is then used as a mask to have the silicon nitride film 38 etched away from the surface of the substrate 10 except for the area underlying the conductor region 12a. As a result of this etching step, the oxide film 36 on the semiconductor substrate 10 is exposed over its area except for the area underlying the residual nitride film region 38. The nitride film region 38 and the coextensive regions of the oxide film 36 underlying the nitride film 38 are to form the dielectric layer of the capacitor 28 of the memory cell 24 shown in FIG. 4. The conductor region 12a on such a nitride film region 38 is then thermally oxidized to grow an oxide layer 42 on the surface of the region 12a. This oxide layer 42 is to form part of an interlevel insulating layer of the device to be fabricated and has a step portion resulting from the step portion of the conductor region 12a. The oxide layer 42 is grown not only on the upper surface and sidewall of the conductor region 12a but slightly along the edges of the silicon nitride film region 38. Thus, the oxide layer 42 has an overhang portion as shown in FIG. 6A. Thereupon, the nitride film 38 and the oxide film 36 are selectively etched away with the oxide film 42 used as a mask to exposed a portion of the surface of the substrate 10. As a result of this etching step, there is a notch 44' adjacent the edges of the remaining nitride and oxide films 38 and 36 as shown in FIG. 6B. A thermal oxidation process is then performed to form a new oxide film 36' on the exposed surface portion of the substrate 10 as shown in FIG. 6C.

Figure 6C:
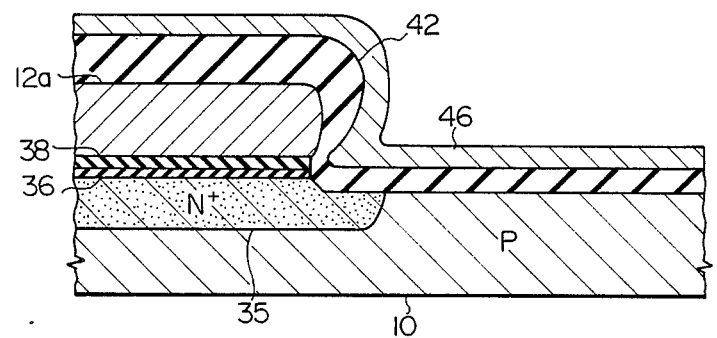
Figure 6D:
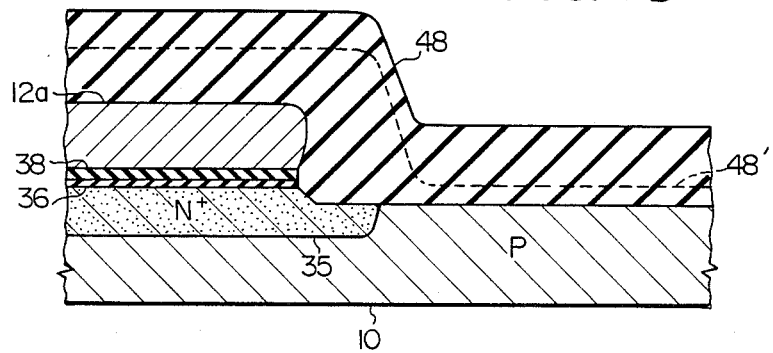

A relatively thick conformal layer 46 of polysilicon is then epitaxially grown on the surfaces of the oxide film 36' and the oxide layer 42 on the conductor region 12a by, for example, chemical vapor deposition techniques as shown in FIG. 6C. The polysilicon 46 has a step portion resulting from the step portion of the oxide layer 42 as shown but is free from an overhand portion by reason of the excellent adherence of polysilicon to the surfaces forming a step portion as previously noted. The polysilicon layer 46 is then thermally oxidized and thickened to form a thicker oxide layer 48 which has resulted in part from the polysilicon layer 46 and in part from the oxide film 36' and the oxide layer 42 as shown in FIG. 6D. The oxide layer 48 grows thicker over its area close to the overhang portion of the oxide layer 42 than over the remaining areas of the oxide layer 48 as will be seen from FIG. 6D and thus provides a smoothly sloping step portion completely filling the notch 44' which has been open below the overhang portion of the oxide layer 42. The oxide layer 48 thus formed is also to form part of the interlevel insulating layer of the device to be fabricated.

Figure 6E:
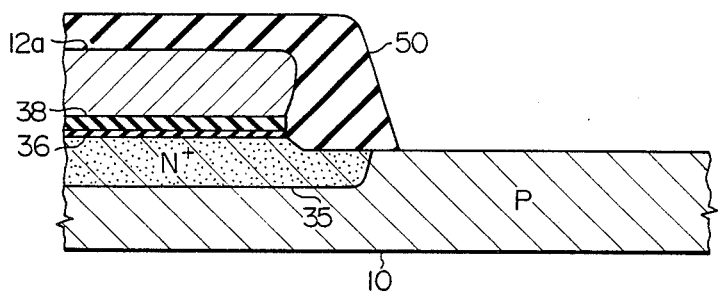

The oxide layer 48 is then etched away throughout its area typically by reactive ion etching techniques in an anisotropic mode. Suitable endpoint control is used for this dry etching step so that the etching will terminate halfway of the initial thickness of the oxide layer 48. It may be noted that the sidewall of the oxide layer 48 is practically unaffected by the etching process by reason of the anisotropic nature of the etch as well known in the art. The result is therefore that the initial oxide layer 48 in its entirety is reduced only in the direction of thickness, leaving a layer 48' having a surface topography indicated by a dotted line in FIG. 6D. The etching being terminated halfway of the initial thickness of the oxide layer 48, the oxide layer 48 is not thoroughly etched away from the surface of the semiconductor substrate 10. The remaining oxide layer layer 48' is then etched by appropriate wet etching techniques until the layer 48' has its area remote from the conductor region 12a completely removed from the surface of the semiconductor substrate 10. The substrate 10 is thus allowed to be exposed adjacent a polysilicon oxide layer 50 which is now formed around the conductor region 12a, as shown in FIG. 6E.

Figure 6F:
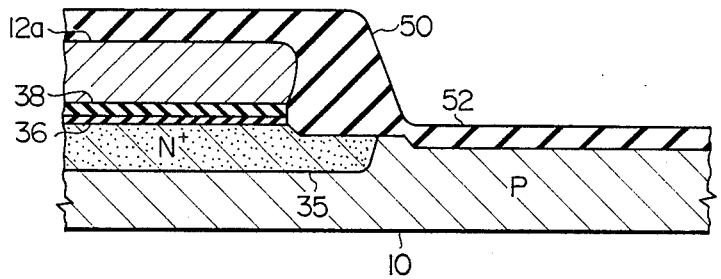

The semiconductor structure thus obtained is subjected to thermal oxidation treatment to grow on the exposed surface of the semiconductor substrate 10 a thin oxide film 52 which merges with the oxide layer 50 as shown in FIG. 6F. This thin oxide film 52 is to form, in part, the gate region of the field-effect transistor 26 of the memory cell 24 shown in FIG. 3. As the oxide film 52 is grown on the surface of the substrate 10, the oxide layer 50 on the conductor region 12a is also slightly thermally oxidated and is therefore allowed to smoothly slope toward the oxide film 52, contributing to moderation of the step portion of the 50. As in the second preferred embodiment of a process according to the present invention, the polysilicon layer 46 which results into a portion of the oxide layer 50 serves to eliminate the notch 44' which would otherwise result from the overhang portion of the polysilicon oxide layer 42 and to alleviate the seriousness of the step portion of the oxide layer 50 which results in part from the oxide layer 42.

Figure 6G:
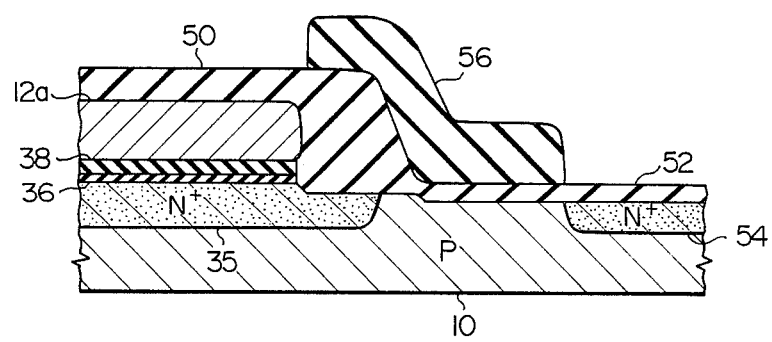

A conformal layer of doped polysilicon is then deposited on the entire surface of the resultant structure by, for example, chemical vapor deposition techniques. The doped polysilicon layer is patterned and etched preferably in an anisotropic mode, to leave a conductor region 12b on the surface of the oxide film 52 as shown in FIG. 6G. This conductor region 12b is to form the gate electrode of the field-effect transistor 28 of the memory cell 24 shown in FIG. 4 and provides, in combination with the conductor region 12a embedded in the oxide layer 50, a first interlevel insulating layer of the device to be fabricated. A suitable donor-type dopant such as phosphorus is then introduced, viz., implanted or diffused, into a selected portion of the semiconductor substrate 10 to form an $n^+$-type region 54 spaced apart from the previously formed $n^+$-type region 35 in the substrate 10 as also shown in FIG. 6G. The newly formed $n^+$-type region 54 of the semiconductor substrate 10 is to form one of the source and drain of the field-effect transistor 26 of the memory cell 24 shown in FIG. 4. On the other hand, the early formed $n^+$-type region 35 of the semiconductor substrate 10 forms not only one electrode of the capacitor 28 as previously noted but also of the other of the source and drain of the field-effect transistor 26 the memory cell 24 shown in FIG. 4. The transistor 26 in the memory cell 24 shown in FIG. 4 being assumed to be of the n-channel type, the $n^+$-type region 54 forms the drain of the transistor 26 and, thus, the n-type region 35 provides the source of the transistor 26.

The resultant structure is then thermally oxidated to grow an oxide layer on the oxide layer 50 and the oxide film 52 and on the conductor region 12b, though not shown in the drawings. This oxide layer is similar to the oxide layer 56 shown in FIG. 5H and is also thicker particularly over the bottoms of the step portions in the underlying topography than over the other areas of the layer. A contact hole is then formed in the toplevel oxide layer to reach the surface of the $n^+$-type region 54b in the substrate 10, though not shown in the drawings. A metallized layer of, for example, aluminum is now deposited, patterned and etched to form a second conductor layer of the device, providing a contact for the $n^+$-type region 54b through the contact hole formed in the toplevel oxide layer and provides the bit line 30 in the memory cell 24 illustrated in FIG. 4. Though not shown in the drawings, the device is further provided with interlevel contact regions providing connections between the first and second conductor layers forming the multilevel conductor structure of the device.

While three preferred embodiments of a process according to the present invention have hereinbefore been described, such embodiments are merely illustrative of the gist of the present invention and may thus be modified in numerous manners if desired or where necessary. While, for example, it has been described that the first conductor layer (described as consisting of the conductor regions 12a and 12b) is of polysilicon and the second conductor layer (described as consisting of the metallization layer 22) is a metallized layer, each of the first and second conductor layers of a semiconductor device to be fabricated by a process according to the present invention may be formed of any desired electrically conductive material. Furthermore, the interlevel insulating layer which has been described as being finally composed of the oxide layer 50, oxide film 52 and oxide layer 56 may be formed by any desired manner insofar as the process includes the steps of forming a layer of polysilicon (such as the polysilicon layer 20 in the first embodiment and the polysilicon layer 46 in the second embodiment) covering the step portion of the first conductor layer on the substrate and the step of thermally oxidating the particular polysilicon layer. Thus, any of the component oxide layers which finally result in the interlevel insulating layer in the semiconductor device in each of the described embodiments may be dispensed with if desired or permissible and any additional oxide layer or layers may be used in addition to such component oxide layers if desired. It may also be added that, insofar as the oxide layer which has resulted from the polysilicon layer has a portion sufficiently covering the step portion of the first conductor layer on the substrate, the remaining portion or part of the remaining portion of the oxide layer may be removed if desired.

What is claimed is:

1. A process of fabricating a semiconductor device, comprising the steps of:
   (a) preparing a silicon substrate having a surface portion,
   (b) forming a first thermally grown silicon oxide film on said surface portion of the silicon substrate,
   (c) forming a silicon nitride film on said silicon oxide film,
   (d) forming a first polysilicon layer on said silicon nitride film,
   (e) selectively etching away the polysilicon layer to leave a polysilicon conductor region, the polysilicon conductor region having a step portion over the silicon substrate,
   (f) etching the silicon nitride and oxide films with said polysilicon conductor region used as a mask to expose said silicon substrate outside the polysilicon conductor region,
   (g) forming a second thermally grown silicon oxide layer in part on said polysilicon conductor region and in part on an exposed surface portion of the silicon substrate, the second silicon oxide layer having a portion overlying the step portion of said polysilicon conductor region and an overhang portion located over said substrate in proximity to said step portion,
   (h) forming a second layer of polysilicon having a portion overlying said step portion of said polysilicon conductor region and fully covering said overhang portion of said silicon oxide layer, and
   (i) thermally oxidating the second layer of polysilicon for forming a polysilicon oxide layer having a portion resulting substantially from said portion overlying said step portion of the polysilicon conductor region, said portion of the polysilicon oxide layer being thicker than another portion of the polysilicon oxide layer and becoming thinner away from said step portion.

2. A process of fabricating a semiconductor device, comprising
   (a) preparing a silicon substrate having a surface portion and a predetermined conductivity type,
   (b) forming a first conductor region in the silicon substrate, the first conductor region being opposite in conductivity type to said silicon substrate and having a step portion over the surface portion of the silicon substrate, (c) forming a dielectric layer on said surface portion of the silicon substrate, (d) forming a first layer of polysilicon on the dielectric layer, (e) selectively etching away the polysilicon layer to leave a second conductor region overlying said first conductor region across said dielectric layer, the second conductor region having a step portion over the silicon substrate, (f) etching said dielectric layer with the polysilicon conductor region used as a mask to enable said silicon substrate to be exposed outside the second conductor region, (g) forming a thermally grown silicon oxide layer in part of said second conductor region and in part on an exposed surface portion of the silicon substrate, the silicon oxide layer having a portion overlying the step portion of said second conductor region and an overhang portion located over said substrate in proximity to said step portion, (h) forming a second layer of polysilicon having a portion overlying said step portion of said second conductor region and fully covering said overhang portion of said silicon oxide layer, and (i) thermally oxidating the second layer of polysilicon for forming a polysilicon oxide layer having a portion substantially resulting from said portion overlying said step portion of the second conductor region, said portion of the polysilicon oxide layer being thicker than another portion of the polysilicon oxide layer and becoming thinner away from said step portion.

3. A process of fabricating a semiconductor single-transistor single-capacitor memory cell device, comprising (a) preparing a silicon substrate of a first conductivity type, (b) forming a field oxide layer defining a cell area within the silicon substrate, (c) forming a first conductor region within said cell area of the silicon substrate, the first conductor region having a second conductivity type which is opposite to said first conductivity type, (d) forming a relatively thin silicon oxide film on said cell area of the silicon substrate, (e) forming a relatively thin silicon nitride film on the silicon oxide film, (f) forming a relatively thick polysilicon layer on the silicon nitride film, (g) selectively etching the polysilicon layer to leave a second conductor region on the silicon nitride film, the second conductor region being located to overlie a portion of said first conductor region across said silicon nitride film, (h) etching the silicon nitride film with the second conductor region used as a mask to enable the silicon nitride film to remain only underneath the second conductor region while exposing said silicon oxide film over its area excluding the area underlying the residual portion of said nitride film, said second conductor region now having a step portion over the surface of said silicon oxide film, (i) thermally oxidating said second conductor region to form a first silicon oxide layer on the second conductor region, the first silicon oxide layer having a step portion covering the step portion of the second conductor region and an overhang portion over the surface of said silicon oxide film, (j) forming an epitaxially grown conformal layer of polysilicon on the resultant structure, the conformal polysilicon layer having a step portion covering the step portion of said first silicon oxide layer and a portion substantially filling said overhang portion of the first silicon oxide layer, (k) thermally oxidating the conformal polysilicon layer to form a second silicon oxide layer which is integral with said first oxide layer and which is thicker over its area close to said overhang portion of the first oxide layer than over the remaining areas of the second oxide layer, (l) etching back the second oxide layer until the silicon substrate is exposed over its area spaced from said first conductor region with a portion of the second oxide layer left on and around said second conductor region, (m) oxidating an exposed surface portion of the silicon substrate to form on the substrate a relatively a thin silicon oxide film which merges with the remaining portion of the second oxide layer, (n) forming a conformal layer of doped polysilicon on the resultant structure, (o) selectively etching the doped polysilicon layer to leave a third conductor region on the exposed surface of the silicon oxide film on the substrate, and (p) injecting a dopant of the second conductivity type into said silicon substrate to form two doped regions which are separate from each other across a portion of the silicon substrate underlying said third conductor region, one of said doped regions merging with said first conductor region in the substrate.

4. A process as set forth in claim 3, in which said second oxide layer is etched back first by anisotropic dry etching until the second oxide layer on the silicon substrate is thinned toward the surface of the substrate and thereafter by wet etching until the remaining oxide layer on the surface of the substrate is totally etched away so that the silicon substrate is exposed over its area spaced from said first conductor region with said portion of the second oxide layer left on and around said second conductor region.

5. A process of fabricating a semiconductor device, comprising (a) preparing a silicon substrate of a first conductivity type, (b) forming a first conductor region in the silicon substrate, the first conductor region having a second conductivity type which is opposite to said first conductivity type, (c) forming a relatively thin silicon oxide film on the silicon substrate, (d) forming a relatively thin silicon nitride film on the silicon oxide film, (e) forming a relatively thick polysilicon layer on the silicon nitride film, (f) selectively etching the polysilicon layer to leave a second conductor region on the silicon nitride film, the second conductor region being located to overlie a portion of said first conductor region across said silicon nitride film, (g) etching the silicon nitride and oxide films with the second conductor region used as a mask to enable the silicon nitride and oxide film to remain only underneath the second conductor region while enabling said silicon substrate to be exposed over its area excluding the area underlying the residual portions of said nitride and oxide films, said second conductor region now having a step portion over the surface of said silicon substrate, (h) thermally oxidating said second conductor region to form a first silicon oxide layer on the second conductor region, the first silicon oxide layer having a step portion covering the step portion of the second conductor and an overhang portion over the surface of said silicon oxide film, (i) forming an epitaxially grown conformal layer of polysilicon on the resultant structure, the conformal polysilicon layer having a step portion covering the step portion of said first silicon oxide layer and a portion substantially filling said overhang portion of the first silicon oxide layer, (j) thermally oxidating the conformal polysilicon layer to form a second silicon oxide layer which is integral with said first oxide layer and which is thicker over its area close to said overhang portion of the first oxide layer than over the remaining areas of the second oxide layer, (k) etching back the second oxide layer until the silicon substrate is exposed over its area spaced from said first conductor region with a portion of the second oxide layer left on and around said second conductor region, (l) oxidating an exposed surface portion of the silicon substrate to form on the substrate a relatively thin silicon oxide film which merges with the remaining portion of the second oxide layer, and (m) forming in the silicon substrate at least one doped region having said second conductivity type, the doped region being separate from said first conductor region through a portion of the silicon substrate.

6. A process as set forth in claim 5, in which said second oxide layer is etched back first by anisotropic dry etching until the second oxide layer on the silicon substrate is thinned toward the surface of the substrate and thereafter by wet etching until the remaining oxide layer on the surface of the substrate is totally etched away so that the silicon substrate is exposed over its area spaced from said first conductor region with said portion of the second oxide layer left on and around said second conductor region.

* * * * *